(12) United States Patent
Bang et al.

(10) Patent No.: US 10,886,326 B2
(45) Date of Patent: Jan. 5, 2021

(54) DISPLAY DEVICE

(71) Applicant: SAMSUNG DISPLAY CO., LTD., Yongin-si (KR)

(72) Inventors: Ki Ho Bang, Yongin-si (KR); Eun Hye Kim, Yongin-si (KR); Sang Hyun Jun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/535,299

(22) Filed: Aug. 8, 2019

(65) Prior Publication Data

US 2020/0161398 A1 May 21, 2020

(30) Foreign Application Priority Data

Nov. 15, 2018 (KR) .......................... 10-2018-0140837

(51) Int. Cl.
*H01L 27/15* (2006.01)
*H01L 27/32* (2006.01)
*H01L 23/31* (2006.01)
*H01L 23/29* (2006.01)

(52) U.S. Cl.
CPC ............ *H01L 27/15* (2013.01); *H01L 23/293* (2013.01); *H01L 23/3135* (2013.01); *H01L 27/3246* (2013.01); *H01L 27/3258* (2013.01); *H01L 2251/558* (2013.01)

(58) Field of Classification Search
CPC ............ H01L 27/3246; H01L 27/3248; H01L 27/3258; H01L 27/326; H01L 27/3262; H01L 27/15; H01L 51/5253; H01L 23/293; H01L 23/3135
See application file for complete search history.

(56) References Cited

U.S. PATENT DOCUMENTS

| | | | | |
|---|---|---|---|---|
| 9,977,303 | B2 * | 5/2018 | Ro | .................. G02F 1/13394 |
| 2014/0353619 | A1 * | 12/2014 | Park | .................. H01L 27/3248 257/40 |
| 2015/0287771 | A1 * | 10/2015 | Lee | .................. H01L 27/3276 257/40 |
| 2017/0040407 | A1 * | 2/2017 | Shin | .................. H01L 27/3276 |

(Continued)

FOREIGN PATENT DOCUMENTS

| KR | 10-2014-0074774 A | 6/2014 |
|---|---|---|
| KR | 10-2016-0054822 A | 5/2016 |

(Continued)

*Primary Examiner* — Scott B Geyer
(74) *Attorney, Agent, or Firm* — Kile Park Reed & Houtteman PLLC

(57) ABSTRACT

A display device includes a substrate that includes a display area and a peripheral area, a transistor in the display area, a pixel electrode connected to the transistor, a common electrode that overlaps the pixel electrode, and an organic insulation layer that is between the common electrode and the substrate, and overlaps at least a part of the peripheral area, wherein a thickness of a portion of the organic insulation layer overlapping the display area, and a thickness of a portion of the organic insulation layer overlapping the peripheral area, are different from each other, and the organic insulation layer includes a valley that penetrates the organic insulation layer, while overlapping the peripheral area.

11 Claims, 7 Drawing Sheets

(56) References Cited

U.S. PATENT DOCUMENTS

| | | | | |
|---|---|---|---|---|
| 2017/0317299 | A1* | 11/2017 | Choi | H01L 51/5253 |
| 2017/0373270 | A1 | 12/2017 | Kim et al. | |
| 2018/0040851 | A1* | 2/2018 | Sasaki | H01L 27/3276 |
| 2018/0102502 | A1* | 4/2018 | Kim | H01L 27/3258 |
| 2018/0123082 | A1* | 5/2018 | Sasaki | H01L 51/5237 |
| 2018/0158956 | A1* | 6/2018 | Koezuka | H01L 27/1225 |
| 2018/0226608 | A1* | 8/2018 | Nakagawa | H01L 51/5246 |
| 2018/0261803 | A1* | 9/2018 | Kitano | H01L 51/0021 |
| 2018/0301651 | A1* | 10/2018 | Kamiya | H01L 51/5072 |
| 2018/0358572 | A1* | 12/2018 | Harada | H01L 51/56 |
| 2018/0366680 | A1* | 12/2018 | Okigawa | H01L 27/3276 |
| 2019/0288046 | A1* | 9/2019 | Park | H01L 27/3276 |
| 2020/0006697 | A1* | 1/2020 | Jung | H01L 27/3276 |

FOREIGN PATENT DOCUMENTS

| | | |
|---|---|---|
| KR | 10-2016-0066133 A | 6/2016 |
| KR | 10-2018-0068011 A | 6/2018 |

\* cited by examiner

DISPLAY DEVICE

CROSS-REFERENCE TO RELATED APPLICATION

Korean Patent Application No. 10-2018-0140837, filed on Nov. 15, 2018, in the Korean Intellectual Property Office, and entitled: "Display Device," is incorporated by reference herein in its entirety.

BACKGROUND

1. Field

Embodiments relate to a display device.

2. Description of the Related Art

A display device includes a display panel, and the display panel includes light emitting elements on a substrate and circuit elements for driving the light emitting elements. The display panel may include an encapsulation substrate to help prevent permeation of external moisture or oxygen to thereby prevent the light emitting elements from being damaged due to the moisture or oxygen.

The above information disclosed in this Background section is only for enhancement of understanding of the background of the invention and therefore it may contain information that does not form the prior art that is already known in this country to a person of ordinary skill in the art.

SUMMARY

Embodiments are directed to a display device that includes a substrate that includes a display area and a peripheral area, a transistor in the display area, a pixel electrode connected to the transistor, a common electrode that overlaps the pixel electrode, and an organic insulation layer that is between the common electrode and the substrate, and overlaps at least a part of the peripheral area, wherein a thickness of a portion of the organic insulation layer overlapping the display area, and a thickness of a portion of the organic insulation layer overlapping the peripheral area, are different from each other, and the organic insulation layer includes a valley that penetrates the organic insulation layer, while overlapping the peripheral area.

The organic insulation layer overlapping the display area may have a first height, the organic insulation layer overlapping the peripheral area may have a second height, and the first height may be higher than the second height.

The first height may be about two times the second height.

The display device may include an encapsulation layer that is on the common electrode and overlaps the display area and the peripheral area, and the encapsulation layer may include a first inorganic layer and a second inorganic layer and an organic layer between the first inorganic layer and the second inorganic layer.

Touch lines may be on the encapsulation layer that overlaps the peripheral area, and a touch electrode may be on the encapsulation layer that overlaps the display area.

One side of the encapsulation layer on which the touch lines are disposed, and one side of the encapsulation layer on which the touch electrode is disposed, may have a step difference.

The organic layer may be disposed in the valley.

The display device may further include a dam disposed in the peripheral area, wherein a distance from the dam to an edge of the display area may be greater than a distance from an edge of the organic layer to the edge of the display area.

The transistor may further include a semiconductor layer on the substrate, a gate electrode overlapping the semiconductor layer, and a source electrode and a drain electrode that are connected to the semiconductor layer, and the display device may further include a first connection member that is on the drain electrode and connecting the pixel electrode and the drain electrode.

The organic insulation layer may include a first organic insulation layer that is between the source electrode and the first connection member and between the drain electrode and the first connection member, and a second organic insulation layer that is between the first connection member and the pixel electrode.

One area overlapping the display area and another area overlapping the peripheral area of at least one of the first organic insulation layer and the second organic insulation layer may have a thickness difference.

Embodiments are also directed to a display device that includes a substrate that includes a display area and a peripheral area, a transistor in the display area, an organic insulation layer that is on the transistor, a light emitting diode connected to the transistor, an encapsulation layer that is on the light emitting diode and includes an organic layer, and touch lines and a touch electrode that are on the encapsulation layer, wherein the organic insulation layer includes a valley that overlaps the peripheral area and the organic layer is disposed in the valley, and the organic insulation layer overlapping the display area and the organic insulation layer overlapping the peripheral area have a step difference.

The transistor may further include a semiconductor layer that is on the substrate, a gate electrode that overlaps the semiconductor layer, and a source electrode and a drain electrode that are connected to the semiconductor layer, wherein the display device may further include a first connection member that is on the drain electrode and connects the pixel electrode and the drain electrode.

The organic insulation layer may include a first organic insulation layer that is between the source electrode and the first connection member and between the drain electrode and the first connection member, and a second organic insulation layer that is between the first connection member and the pixel electrode.

One area overlapping the peripheral area of at least one of the first organic insulation layer and the second organic insulation layer may be thinner than another area overlapping the display area.

The encapsulation layer may include a first inorganic layer, a second inorganic layer, and an organic layer, wherein the organic layer may be between the first inorganic layer and the second inorganic layer.

Embodiments are also directed to a display device that includes a substrate that includes a display area and a peripheral area, a semiconductor layer that is on the substrate that overlaps the display area, a gate electrode that overlaps the semiconductor layer, a source electrode and a drain electrode that are connected to the semiconductor layer, a first connection member that is on the drain electrode and connected to the drain electrode, a pixel electrode that is on the first connection member and connected to the first connection member, an emission layer and a common electrode that overlap the pixel electrode and an organic insulation layer that is between the common electrode and the substrate, and overlaps at least a part of the peripheral area, wherein the organic insulation layer includes a valley that overlaps the peripheral area, and a power wire that is disposed in the peripheral area overlaps the valley.

The display device may further include a second connection member that is on the same layer as the first connection member, while being disposed in the peripheral area, and the second connection member may overlap the valley.

The organic insulation layer may include a first organic insulation layer that is between the drain electrode and the first connection member, and a second organic insulation layer that is between the first connection member and the pixel electrode, and the first organic insulation layer may include a first valley and the second organic insulation layer may include a second valley.

The display device may further include an encapsulation layer that is on the common electrode, wherein the encapsulation layer may include a first inorganic layer and a second inorganic layer, and an organic layer between the first inorganic layer and the second inorganic layer, and the organic layer is disposed in the second valley.

BRIEF DESCRIPTION OF THE DRAWINGS

Features will become apparent to those of skill in the art by describing in detail example embodiments with reference to the attached drawings in which.

DETAILED DESCRIPTION

Figure 1:
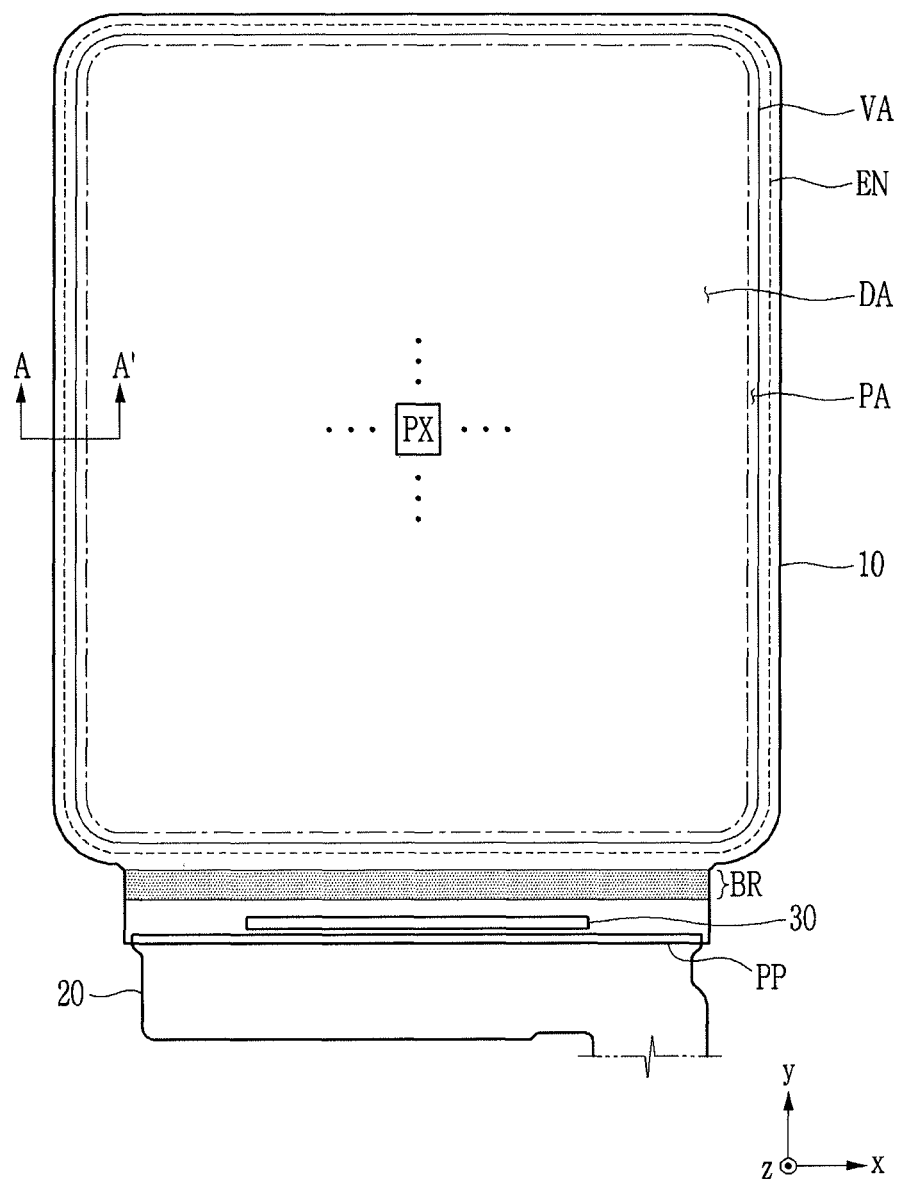
FIG. 1 illustrates a schematic top plan view of a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it may be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

Figure 2:
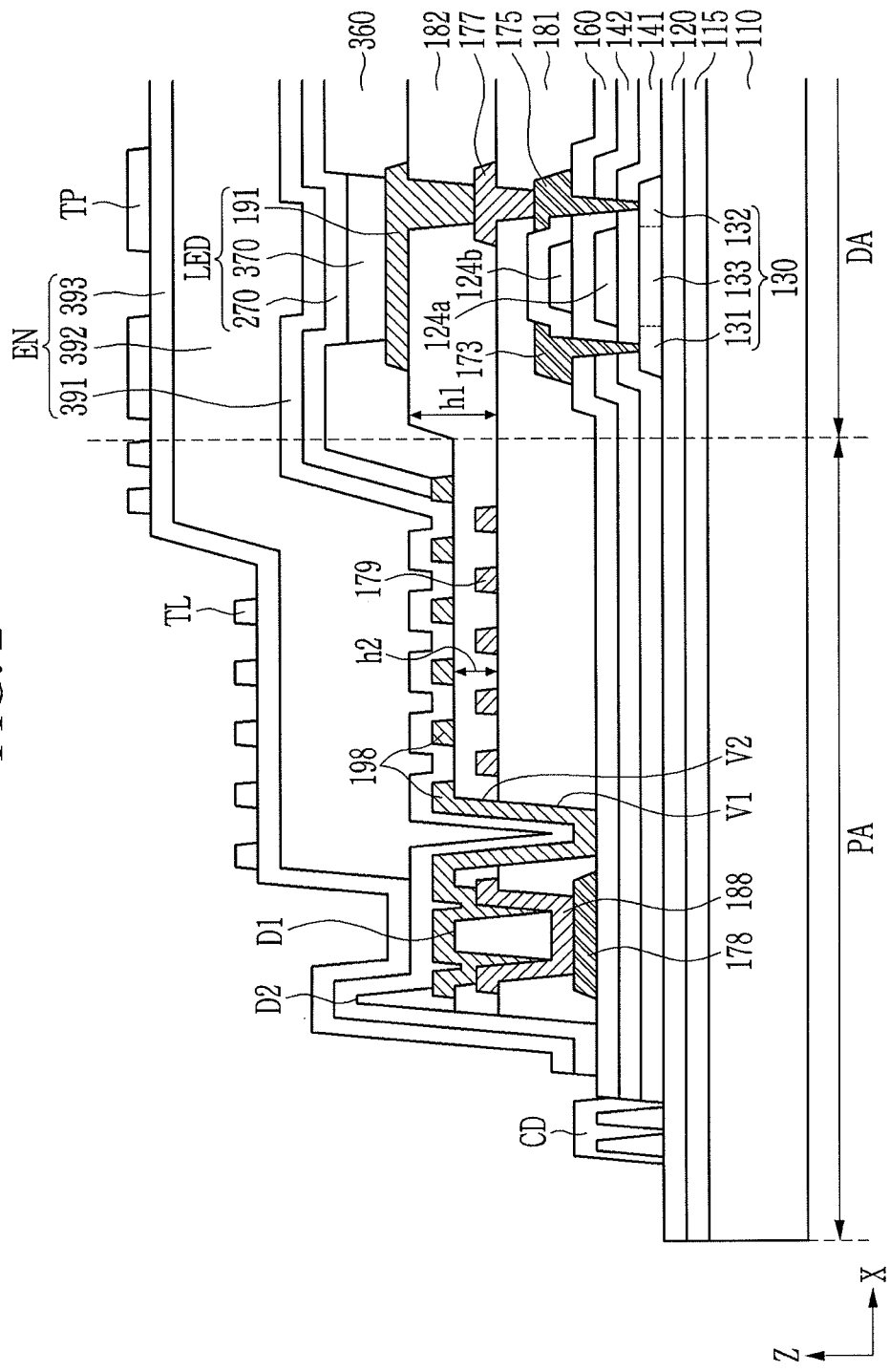
FIG. 2 illustrates a schematic cross-sectional view of FIG. 1, taken along the line A-A'.

Hereinafter, a display device according to an example embodiment will be described with reference to FIG. 1 and FIG. 2. FIG. 1 is a schematic top plan view of a display device according to an example embodiment, and FIG. 2 is a schematic cross-sectional view of FIG. 1, taken along the line A-A'.

Referring to FIG. 1, the display device according to the present example embodiment may include a driving unit that includes a display panel 10, a flexible printed circuit film 20 bonded to the display panel 10, and an IC chip 30.

The display panel 10 includes a display area DA that corresponds to a screen where an image is displayed, and a peripheral area PA that is disposed at the periphery of the display area DA. In FIG. 1, an inner side of the quadrangular single-dot chain line (------) corresponds to the display area DA, and an outer side of the single-dot chain line corresponds to the peripheral area PA.

In the display area DA, pixels PX may be arranged in the form of, for example, a matrix. Signal lines such as scan lines (gate lines), light emission control lines, data lines, driving voltage lines, and the like may be disposed in the display area DA. Each pixel PX may be connected to a scan line, a light emission control line, a data line, and a driving voltage line. Each pixel PX may receive a scan signal (gate signal), a light emission control signal, a data signal, and a driving voltage from the signal lines. Each pixel PX may include a light emitting element, which may be an organic light emitting diode.

The display area DA may include a touch portion for sensing contact or non-contact touch of a user.

In FIG. 1, the display area DA is illustrated as a rounded quadrangle as an example. The display area DA may have various shapes such as a polygon, a circle, an oval, and the like.

Circuits and/or signal lines may be disposed in the peripheral area PA to generate and/or transmit various signals applied to the display area DA. In the present example embodiment, a pad portion PP is disposed in the peripheral area PA of the display panel 10, and pads are formed in the pad portion PP to receive external signals of the display panel 10. The pad portion PP may extend in a first direction (x-axis direction) along the periphery of one edge of the display panel 10. The flexible printed circuit film 20 may be bonded to the pad portion PP, and pads of the flexible printed circuit film 20 may be electrically connected to the pads of the pad portion PP.

A driving unit that generates and/or processes various signals for driving the display panel 10 may be disposed in the peripheral area PA. The driving unit may include a data driver that applies a data signal to the data lines, an emission driver that applies an emission control signal to the emission control lines, and a signal controller that controls a data driver, a scan driver, and the emission driver. The scan driver and the emission driver may be integrated with the display panel 10, or may be disposed at left and right sides or at one side of the display area DA. The data driver and the signal controller may be provided as IC chips (driving IC chips) 30, and the IC chip 30 may be installed in the peripheral area PA of the display panel 10. The IC chip 30 may be installed in the flexible printed circuit film, which may be bonded to the display panel 10 and thus electrically connected to the display panel 10.

The display panel 10 may include an encapsulation layer EN that entirely covers the display area DA. The encapsulation layer EN may prevent permeation of moisture or oxygen into the display panel 10 by sealing the display area DA, and for example, prevent permeation of moisture or oxygen into light emitting elements. An edge of the encapsulation layer EN may be between an edge of the display panel 10 and the display area DA.

A valley VA that surrounds the display area DA may be disposed in the peripheral area PA. The valley VA refers to an area where an organic insulation layer (for example, a first organic insulation layer 181 described in detail below in connection with valley V1) is removed. An organic insulation layer may be susceptible to moisture permeation. Thus, in the valley VA where the organic insulation layer is removed, moisture permeating along a part of the organic insulation layer may be prevented from passing into the display area DA.

The valley VA may be disposed along an edge of the display panel 10, and for example, may be disposed along four edges of the display panel 10. Edges of the valley VA may be generally parallel to the edges of the display panel 10.

The display panel 10 may include a bending region BR. The bending region BR may be disposed in the peripheral area PA between the display area DA and the pad portion PP. The bending area BR may be disposed to cross the display panel 10 in the first direction (x-axis direction). The display panel 10 may be bent with a predetermined curvature radius with respect to a bending axis that is parallel to the first direction (x-axis direction) in the bending area BR. When the display panel 10 is a top emission type, the pad portion PP and the flexible printed circuit board 20 that are disposed farther away from the display area DA than the bending area BR may be bent to be disposed behind the display panel 10. In an electronic device to which the display device is applied, the display panel 10 may be in such a bent state. The bending area BR may be bent with respect to one bending axis, or may be bent with respect to two or more bending axes. In the drawing, the bending area BR is disposed in the peripheral area PA, but the bending area BR may be disposed through the display area DA and the peripheral area PA or may be disposed in the display area DA.

Hereinafter, a cross-sectional structure of a display panel 10 according to an example embodiment will be described in detail with reference to FIG. 2. FIG. 2 schematically shows a cross-section of an example embodiment at the periphery of the left edge of the display panel 10. The periphery of the right edge of the display panel 10 and the periphery of the left edge of the display panel 10 may be substantially symmetrical to each other.

Referring to FIG. 2, the display area DA will be described, then the peripheral area PA will be described.

A substrate 110 includes the display area DA and the peripheral area PA, and a plurality of layers, wires, and elements are in the display area DA. Although many pixels may be disposed in the display area DA of the display panel 10, only one pixel will be illustrated to avoid complexity in the drawings. In addition, each pixel PX may include, for example, multiple transistors, a capacitor, and a light emitting element, but for clarity of explanation a stacking structure of the display panel 10 will be described with particular reference to one transistor and one light emitting element LED connected to the transistor.

The substrate 110 may be a flexible substrate or a rigid substrate. The substrate 110 may include a polymer, for example, polyimide, polyamide, polycarbonate, polyethylene terephthalate, and the like, or glass, quartz, ceramic, and the like.

A barrier layer 115 may be on the substrate 110 and may help prevent permeation of external moisture or impurities. The barrier layer 115 may include an inorganic insulation material such as a silicon oxide ($SiO_x$), a silicon nitride ($SiN_x$), and the like.

A buffer layer 120 may be on the barrier layer 115. The buffer layer 120 may help block an impurity, which may be dispersed in a semiconductor layer 130, from the substrate 110 during a process for forming the semiconductor layer 130, and may reduce stress applied to the substrate 110. The buffer layer 120 may include an inorganic insulation material such as a silicon oxide, a silicon nitride, and the like.

The semiconductor layer 130 may be on the buffer layer 120. The semiconductor layer 130 may include a channel region 133 that overlaps a gate electrode 124a, a source region 131, and a drain region 132. The source region 131 and the drain region 132 disposed at opposite sides of the channel region 133 may each be doped with an impurity. The semiconductor layer 130 may include a polysilicon, an amorphous silicon, or an oxide semiconductor.

A first insulation layer 141 that includes an inorganic insulation material such as a silicon oxide, a silicon nitride, and the like, or an organic insulation material, may be on the semiconductor layer 130. The first insulation layer 141 may include a portion serving as a first gate insulation layer.

A first gate conductor, which may include the scan lines and the gate electrode 124a of the transistor, may be on the first insulation layer 141. The first gate conductor may include a metal such as molybdenum (Mo), copper (Cu), aluminum (Al), silver (Ag), chromium (Cr), tantalum (Ta), titanium (Ti), and the like, or a metal alloy thereof.

A second insulation layer 142 may be on the first insulation layer 141 and the first gate conductor. The second insulation layer 142 may include an inorganic insulation material such as a silicon oxide, a silicon nitride, and the like, or an organic insulation material. The second insulation layer 142 include a portion serving as a second gate insulation layer.

A second gate conductor such as a storage line including a storage electrode 124b may be on the second insulation layer 142. The second gate conductor may include a metal such as molybdenum (Mo), copper (Cu), aluminum (Al), silver (Ag), chromium (Cr), tantalum (Ta), titanium (Ti), and the like, or a metal alloy thereof.

A third insulation layer 160 may be on the second gate conductor. The third insulation layer 160 may include an inorganic insulation material such as a silicon oxide, a silicon nitride, and the like, or an organic insulation material.

A first data conductor, which may include data lines, a driving voltage line, a power wire 178, a source electrode 173 of the transistor, and a drain electrode 175 of the transistor, may be on the third insulation layer 160.

The source electrode 173 and the drain electrode 175 may be respectively connected to the source region 131 and the drain region 132 of the semiconductor layer 130 through contact holes formed in the third insulation layer 160, the second insulation layer 142, and the first insulation layer 141.

The first data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like, or a metal alloy thereof. The data conductor may be a multilayer such as titanium/aluminum/titanium (Ti/Al/Ti), titanium/copper/titanium (Ti/Cu/Ti), or molybdenum/aluminum/molybdenum (Mo/Al/Mo).

The gate electrode 124a, the source electrode 173, and the drain electrode 175 form a transistor, together with the semiconductor layer 130. In the transistor illustrated in the drawing, the gate electrode 124a is disposed above the semiconductor layer 130, but the structure of the transistor may be variously modified.

The above-noted first organic insulation layer 181 may be on the third insulation layer 160 and the first data conductor (i.e., on the power wire 178, the source electrode 173, and the drain electrode 175). The first organic insulation layer 181 may include an organic insulating material, for example, a polyimide, an acryl-based polymer, a siloxane-based polymer, and the like, and may also include an inorganic insulating material.

As described in detail below, a portion of the first organic insulation layer 181 in the peripheral area PA may include a first valley V1 in which some of the first organic insulation layer 181 is removed.

A second data conductor, which may include a first connection member 177, a driving control signal line 179, and a second connection member 188, may be on the first organic insulation layer 181.

The first connection member 177 may connect the drain electrode 175 and a pixel electrode 191, which will be described below. The first connection member 177 reduces resistance between the drain electrode 175 and the pixel electrode 191 such that a light emitting element that may be driven at a high frequency, while having high luminance, may be provided.

A second organic insulation layer 182 may be on the second data conductor and the first organic insulation layer 181. The second organic insulation layer 182 may include an organic insulating material, and may include, for example, a polyimide, an acryl-based polymer, and the like.

The pixel electrode 191 of the light emitting diode LED may be on the second organic insulation layer 182. The pixel electrode 191 may be connected to the first connection member 177 through a contact hole formed in the second organic insulation layer 182, and may be connected to the drain electrode 175 through the first connection member 177.

The pixel electrode 191 may include a metal such as silver (Ag), nickel (Ni), gold (Au), platinum (Pt), aluminum (Al), copper (Cu), aluminum-neodymium (AiNd), aluminum-nickel-lanthanum (AlNiLa), and the like, or a metal alloy thereof. Alternatively, the pixel electrode 191 may include a transparent conductive material such as indium tin oxide (ITO), indium zinc oxide (IZO), and the like. The pixel electrode 191 may be a multilayer such as ITO/Ag/ITO, ITO/Al, and the like.

A barrier rib 360 having an opening that overlaps the pixel electrode 191 may be on the second organic insulation layer 182. The opening of the barrier rib 360 may define each pixel area. The barrier rib 360 may serve as a pixel defining layer. The barrier rib 360 may include an organic insulating material or an inorganic insulating material.

An emission layer 370 may be disposed on the pixel electrode 191 to overlap the opening defined by the barrier rib 360.

A common electrode 270 may be on the emission layer 370. The common electrode 270 may be formed of a thin metal having a low work function such as calcium (Ca), barium (Ba), magnesium (Mg), aluminum (Al), silver (Ag), and the like, such that the common electrode 270 has a property of light transmission. The common electrode 270 may include a transparent conductive material such as ITO, IZO, and the like.

The pixel electrode 191, the emission layer 370, and the common electrode 270 of each pixel form a light emitting diode LED such as an organic light emitting diode.

An encapsulation layer EN may be on the common electrode 270 and may encapsulate the light emitting diode LED to help prevent permeation of external moisture or oxygen. The encapsulation layer EN may cover the entire area of the display area DA, and edges of the encapsulation layer may be disposed in the peripheral area.

The encapsulation layer EN may include a structure in which one or more inorganic layers and one or more organic layers are stacked. In some example embodiments, the encapsulation layer EN may include a first inorganic layer 391, an organic layer 392, and a second inorganic layer 393. In the encapsulation layer EN, the first inorganic layer 391 and the second inorganic layer 393 may help prevent permeation of moisture and the like, and the organic layer 392 may planarize a surface of the encapsulation layer EN, for example, a top surface of the encapsulation layer EN.

The first inorganic layer 391 and the second inorganic layer 393 may include an inorganic insulation material such as a silicon oxide, a silicon nitride, and the like. The organic layer 392 may include an organic material such as acrylic resin, a methacrylic resin, a polyisoprene, a vinyl resin, an epoxy resin, a urethane resin, a cellulose resin, and a perylene resin.

Although it is not illustrated in the present specification, a polarization layer may be on the encapsulation layer EN to reduce reflection of external light.

A touch electrode TP for sensing a touch may be on the second inorganic layer 393 of the encapsulation layer EN. The touch electrode TP may be between the encapsulation layer EN and the polarization layer. The touch electrode TP may be formed in the shape of a plurality of blocks, and may include a transparent conductive material such as ITO and the like, or may include a metal mesh.

The touch electrode TP according to an example embodiment may be directly on the encapsulation layer EN rather than being attached to an additionally provided touch panel. Compared to a case of additionally manufacturing a touch panel and attaching a touch electrode to the touch panel, a process for forming the touch electrode TP may be simplified and a light-weight and thin display device may be provided.

Hereinafter, constituent elements disposed in the peripheral area PA will be described. The constituent elements disposed in the peripheral area PA may be explained in connection with the components disposed in the display area DA, and duplicated explanations may be partially omitted.

The substrate 110, the barrier layer 115, the buffer layer 120, the first insulation layer 141, the second insulation layer 142, and the third insulation layer 160, which are respectively extended from the display area DA, may be sequentially stacked in the peripheral area PA.

An edge of the first insulation layer 141, an edge of the second insulation layer 142, and an edge of the third insulation layer 160 may be overlapped with each other. For example, the edge of the first insulation layer 141, the edge of the second insulation layer 142, and the edge of the third insulation layer 160 may be substantially aligned.

The edge of the first insulation layer 141, the edge of the second insulation layer 142, and the edge of the third insulation layer 160 may be disposed inside the edge of the substrate 110. Thus, the edge of the first insulation layer 141, the edge of the second insulation layer 142, and the edge of the third insulation layer 160 may be disposed closer to the display area DA than the edge of the substrate 110.

In the peripheral area PA, a crack dam CD may be disposed at the edge of the first insulation layer 141, the edge of the second insulation layer 142, and the edge of the third insulation layer 160. The crack dam CD may help to prevent spread of cracks, which may occur in an inorganic insulation layer such as the barrier layer 115, the buffer layer 120, and the like when the display panel 10 is cut corresponding to the edge of the substrate 110. The crack dam CD may be formed of an organic material, and for example, may be formed of the same material in the same process as at least one of the first organic insulation layer 181, the second organic insulation layer 182, and the barrier rib 360.

The crack dam CD may cover at least one edge of the first insulation layer 141, the second insulation layer 142, and the third insulation layer 160. In another implementation, the crack dam CD may not overlap the first insulation layer 141, the second insulation layer 142, and the third insulation layer 160.

A power wire 178 may be on a portion of the third insulation layer 160, disposed in the peripheral area PA. The power wire 178 may be on the same layer as the source electrode 173 and the drain electrode 175 disposed in the display area DA. The power wire 178 may be formed of the same material in the same process as the first data conductor that includes the source electrode 173 and the drain electrode 175.

The power wire 178 may transmit a power voltage having a predetermined level, which may be applied to the light emitting diode LED, and may transmit, for example, a common voltage ELVSS. The power wire 178 may be electrically connected to the pad portion PP through a first end and a second end thereof, and may surround the display area DA.

The first organic insulation layer 181 may be on the power wire 178 and the third insulation layer 160.

The first organic insulation layer 181 that overlaps the peripheral area PA may include the above-noted first valley V1. The first valley V1 refers to an area from which the first organic insulation layer 181 is removed. The first valley V1 may block a movement path through which the first organic insulation layer 181 is introduced from outside the substrate 110 to help prevent permeation of moisture into the display area DA.

The first valley V1 may penetrate, for example, completely penetrate, the first organic insulation layer 181. The first valley V1 may have a height that is substantially the same as a thickness of the first organic insulation layer 181.

The driving control signal line 179 and the second connection member 188 may be on a portion of the first organic insulation layer 181, overlapping the peripheral area PA. The driving control signal line 179 and the second connection member 188 may be on the same layer as the first connection member 177 that is disposed in the display area DA. The driving control signal line 179 and the second connection member 188 may be formed through the same process as the first connection member 177, and may include the same material as the first connection member 177.

The driving control signal line 179 may transmit signals such as a vertical start signal, a clock signal, and the like, and signals that provide a low voltage of a specific level to a scan driver and/or a light emitting driver which may be disposed in a driving circuit area in the peripheral area PA.

The second connection member 188 may be on the first organic insulation layer 181, and may be connected to the power wire 178. A part of the first organic insulation layer 181, overlapping the power wire 178, may be removed for connection between the second connection member 188 and the power wire 178.

The second organic insulation layer 182 may be on the first organic insulation layer 181, the driving control signal line 179, and the second connection member 188.

A thickness of the second organic insulation layer 182 disposed in the peripheral area PA may be different from a thickness of the second organic insulation layer 182 disposed in the display area DA. The second organic insulation layer 182 overlapping the display area DA may have a first height h1 and the second organic insulation layer 182 disposed in the peripheral area PA may have a second height h2. In the present example embodiment, the first height h1 may be higher than the second height h2, and for example, the first height h1 may be about two times the height h2. One side (for example, a top surface) of the second organic insulation layer 182 disposed in the peripheral area PA and one side (for example, a top surface) of the second organic insulation layer 182 disposed in the display area DA may have a step difference.

The second organic insulation layer 182 having a plurality of areas, each having a different height, may be formed through a single process, and for example, may be formed by using a half-tone mask.

The second organic insulation layer 182 may include a second valley V2. The second valley V2 refers to an area from which the second organic insulation layer 182 is removed. The second valley V2 may block a movement path of moisture or a foreign particle moving through the second organic insulation layer 182 or the first organic insulation layer 181 from the outside to thereby prevent permeation of the external moisture or foreign particle into the display area DA.

The second valley V2 may penetrate, for example, completely penetrate, the second organic insulation layer 182 disposed in the peripheral area PA. The second valley V2 may have a height that is substantially the same as a thickness of the second organic insulation layer 182 disposed in the peripheral area PA. The second valley V2 may have the same height as the second height h2.

In some example embodiments, the first valley V1 and the second valley V2 may overlap each other. An edge of the first valley V1 and an edge of the second valley V2 may be aligned, while overlapping each other. When the first valley V1 and the second valley V2 are substantially overlapped with each other, they may be regarded as a single valley.

A third connection member 198 that is on the same layer as the pixel electrode 191 may be on the second organic insulation layer 182. The third connection member 198 may be formed of the same material through the same process as the pixel electrode 191.

The third connection member 198 may be connected to the power wire 178 through the second connection member 188. The third connection member 198 may be connected to the common electrode 270 that overlaps the display area DA. The power wire 178 may be connected to the common electrode 270 through the third connection member 198 and the second connection member 188. When the power wire 178 transmits a common voltage ELVSS as a power voltage, the common electrode 270 may receive the common voltage ELVSS.

The third connection member 198 on the second organic insulation layer 182 may have a patterned shape. In the present example embodiment, the third connection member 198 and the driving control signal line 179 may not be substantially overlapped with each other along a Z-axis direction. The driving control signal line 179 may also have a patterned shape, and may be disposed in an area that does not overlap the third connection member 198. The third connection member 198 and the driving control signal line 179 may be disposed to be misaligned with or offset from each other. In a plane view, the third connection member 198 and the driving control signal line 179 may be disposed in misaligned areas, and thus entirely form a planar shape. Since the third connection member 198 and the driving control signal 179 are misaligned, a signal that is generated from a lower portion but unnecessary in touch lines may be shielded.

The third connection member 198 may be disposed in the first valley V1 and the second valley V2. The third connection member 198 may have a shape that penetrates the first organic insulation layer 181 and the second organic insulation layer 182. When the first valley V1 and the second valley V2 are filled with a material other than an organic material (like the third connection member 198), moisture or a foreign particle moved along the organic insulation layer may be prevented from permeating into the display area DA.

At least one of dams D1 and D2 may be disposed in the peripheral area PA. The dams D1 and D2 may be on the third insulation layer 160.

The dams D1 and D2 may prevent an organic material having fluidity (like a monomer used in a process for forming the organic layer 392 of the encapsulation layer EN) from overflowing. Thus, the edge of the organic layer 392 of the encapsulation layer EN may be substantially more inside than the dams D1 and D2, and for example may be disposed inside the first dam D1. The edge of the organic layer 392 may be between the dams D1 and D2 and the display area DA. The edge of the organic layer 392 may be disposed closer to the display area DA than the edges of the dams D1 and D2.

The dams D1 and D2 may include at least one layer. The dams D1 and D2 may be formed by using the organic insulation layer, the inorganic insulation layer, or the barrier rib disposed in the display area DA.

The first dam D1 according to an example embodiment may include one layer. In the present example embodiment, the first dam D1 may be formed of the same material through the same process as the second organic insulation layer 182. The first dam D1 may be formed of the same material through the same process as the barrier rib 360.

The second dam D2 according to an example embodiment may include a plurality of layers. The second dam D2 may include at least one of a layer formed of the same material through the same process as the first organic insulation layer 181, a layer formed of the same material through the same process as the second organic insulation layer 182, and a layer formed of the same material through the same process as the barrier rib 360.

The encapsulation layer EN extended from the display area DA may be disposed in the peripheral area PA. The first inorganic layer 391 and the second inorganic layer 393 included in the encapsulation layer EN may extend near an edge of the peripheral area PA, in which the third insulation layer 160 is disposed. The first inorganic layer 391 and the second inorganic layer 393 of the encapsulation layer EN may extend over the dams D1 and D2, thereby covering them. In the present example embodiment, a contact area of the first inorganic layer 391 and the second inorganic layer 393 is increased, and accordingly, a bonding force between the first inorganic layer 391 and the second inorganic layer 393 may be increased.

The edge of the organic layer 392 may be between the first dam D1 and the valleys V1 and V2. The organic layer 392 may be formed at a location that does not exceed the first dam D1, while filling the valleys V1 and V2. The organic layer 392 may be disposed in the valleys V1 and V2.

The organic layer 392 may be formed of an organic material such as a monomer or a reaction product thereof. The organic material may flow into the first valley V1 and the second valley V2 during a process for forming the organic layer 392. A height of the second valley V2 may be determined by a thickness of the second organic insulation layer 182, and according to the example embodiment, a thickness of the second organic insulation layer 182 disposed in the peripheral area PA may be thinner than a thickness of the second organic insulation layer 182 disposed in the display area DA, and accordingly the height of the second valley V2 may be lowered. Thus, the organic material provided during the process for forming the organic layer 392 may have an edge that is between the first dam D1 and the valleys V1 and V2, while sufficiently filling the first valley V1 and the second valley V2. According to the present example embodiment, the organic layer 392 may have a flat top surface.

As compared to the above-described example embodiment, if the height of the second valley V2 in the peripheral area PA is substantially the same as the thickness of the second inorganic insulation layer 182 in the display area DA, a significant amount of organic material may be required to fill the first and second valleys V1 and V2. In this case, the organic material may not flow to the periphery of the first dam D1 after filling the first and second valleys V1 and V2, or may not completely fill the first and second valleys V1 and V2. Accordingly, the top surface of the organic layer 392 may be recessed such that the organic layer 392 may not have a flat top surface. The touch lines TL connected to a touch electrode TP may be on the top surface of the organic layer 392, and it may not be easy to form the touch lines TL if the top surface of the organic layer 392 is not planarized, and a short-circuit failure may occur.

The plurality of touch lines TL that are connected to the touch electrode TP disposed in the display area DA may be on a top surface of the encapsulation layer EN. The touch lines TL are connected to the touch electrode TP and transmit a touch sense signal. The touch lines TL may be formed of the same material through the same process as the touch electrode TP, or may be formed of a different material through a different process from the touch electrode TP.

According to the present example embodiment, the touch lines TL disposed in the peripheral area PA and the touch electrode TP disposed in the display area DA may have a step difference. Thus, one side of the encapsulation layer EN, in which the touch lines TL are disposed, and one side of the encapsulation layer EN, in which the touch electrode TP is disposed, may have a step difference.

A protection film (not shown) disposed below the substrate 110 may be further included. The protection film may be attached to a rear side of the display panel by using an adhesive, or may be formed through a coating process without using the adhesive. The protection film may include a plastic such as polyethylene terephthalate, polyethylene naphthalate, a polyimide, polyethylene sulfide, and the like.

Figure 3:
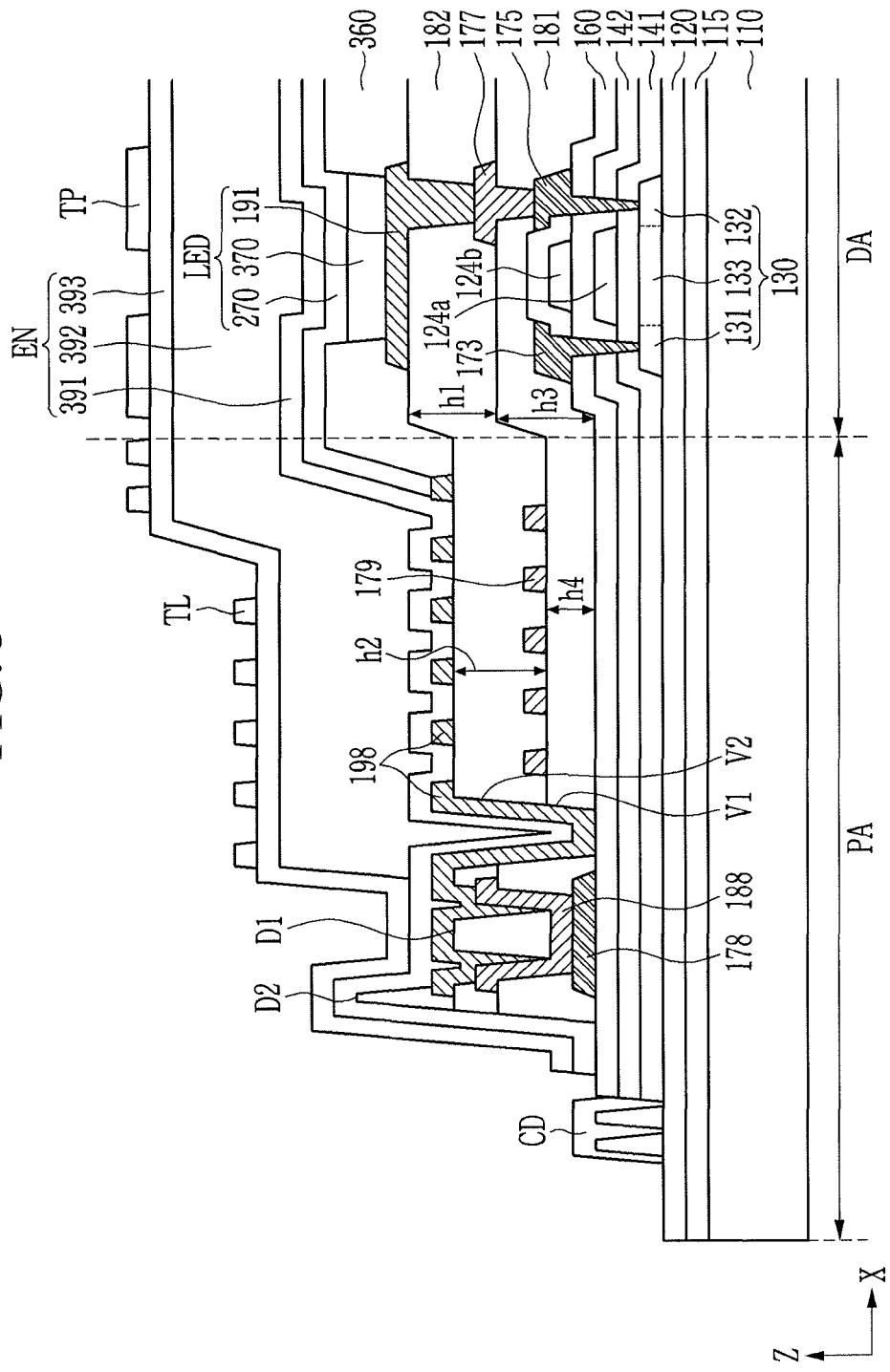
FIG. 3 illustrates a schematic cross-sectional view of FIG. 1, taken along the line A-A'.
Figure 4:
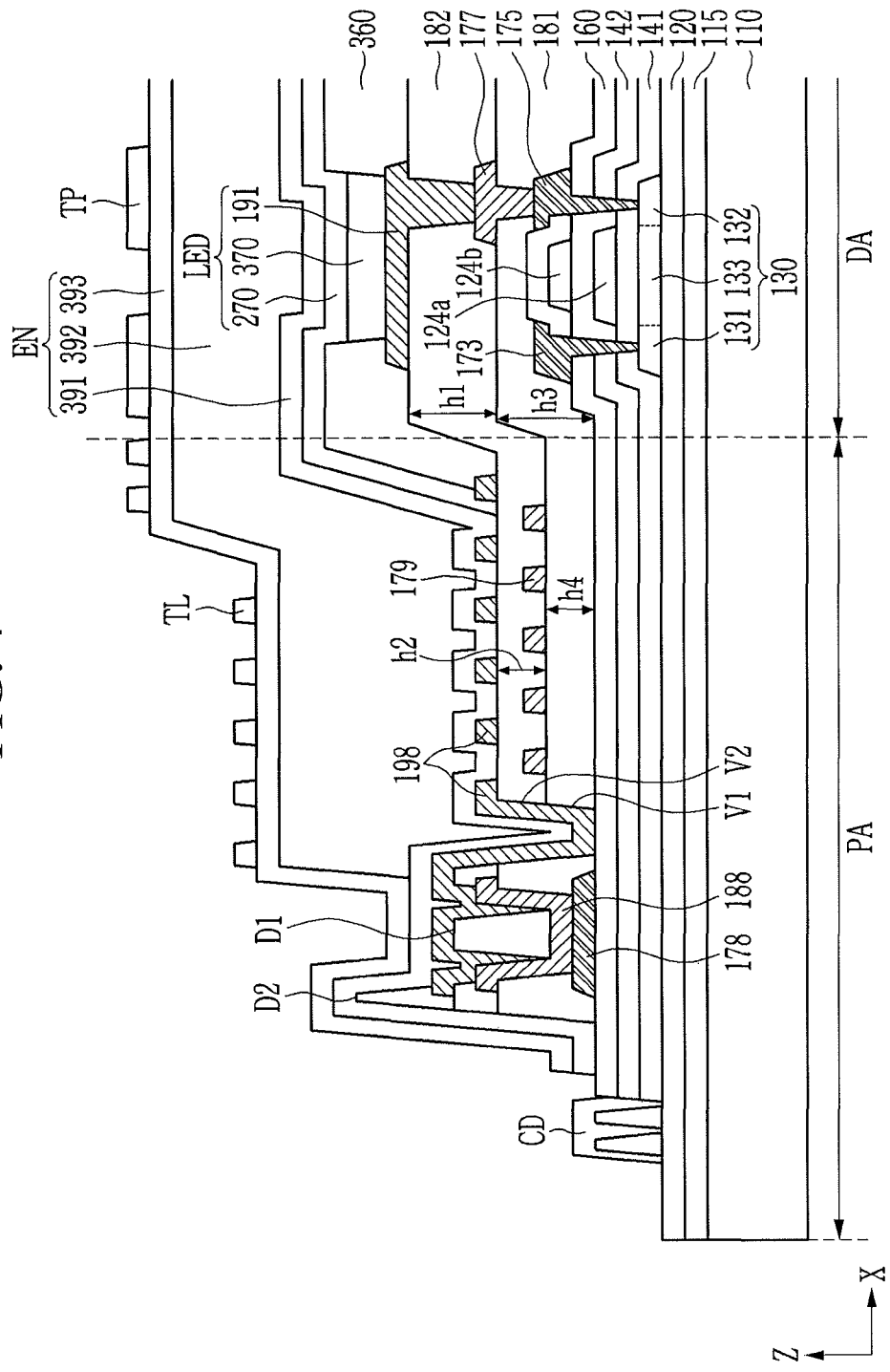
FIG. 4 illustrates a schematic cross-sectional view of FIG. 1, taken along the line A-A'.
Figure 5:
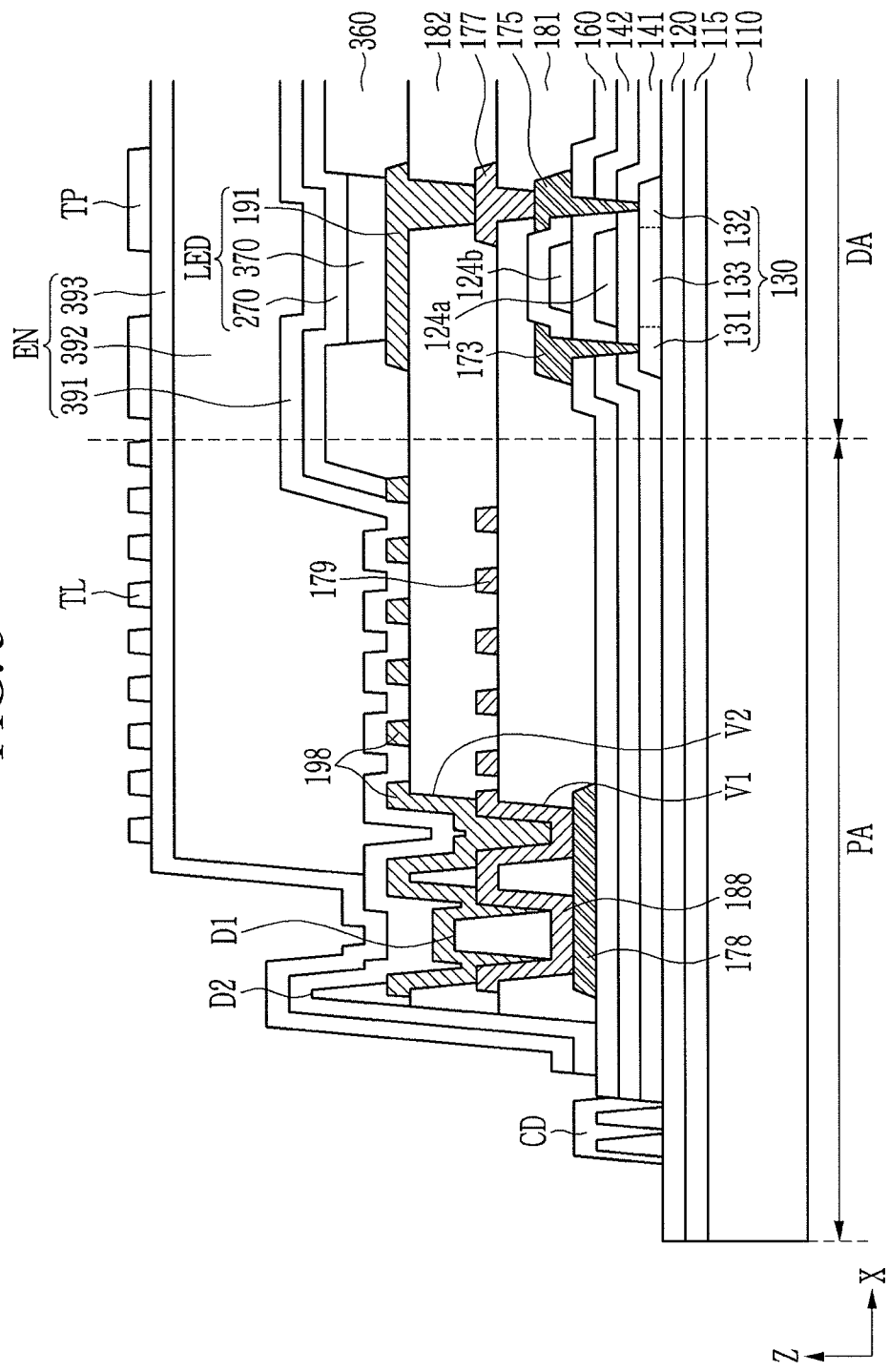
FIG. 5 illustrates a schematic cross-sectional view of FIG. 1, taken along the line A-A'.

Hereinafter, display devices according to various example embodiments will be described respectively with reference to FIG. 3 to FIG. 5. FIG. 3 is a cross-sectional view of an example embodiment of FIG. 1, taken along the line A-A', FIG. 4 is a cross-sectional view of an example embodiment of FIG. 1, taken along the line A-A', and FIG. 5 is a cross-sectional view of an example embodiment of FIG. 1, taken along the line A-A'. Constituent elements disposed in display areas DA shown in FIG. 3 to FIG. 5 are the same as those described with reference to FIG. 2, and therefore a description will be omitted.

First, referring to FIG. 3, a substrate 110, a barrier layer 115, a buffer layer 120, a first insulation layer 141, a second insulation layer 142, a the third insulation layer 160 extended from a display area DA may be sequentially stacked in a peripheral area PA.

The first insulation layer 141, the second insulation layer 142, and the third insulation layer 160 may be aligned at their edges. For example, the edge of first insulation layer 141, the edge of the second insulation layer 142, and the edge of the third insulation layer 160 may be overlapped with each other.

In the peripheral area PA, the crack dam CD may be disposed at the edges of the first insulation layer 141, the second insulation layer 142, and the third insulation layer 160. The crack dam CD may prevent spread of cracks which may occur in an inorganic insulation layer such as the barrier layer 115, the buffer layer 120, and the like when the display panel 10 is cut corresponding to the edge of the substrate 110. The crack dam CD may be formed of an organic material or an inorganic material, and for example, may be formed of the same material in the same process as at least one of the first organic insulation layer 181, the second organic insulation layer 182, and the barrier rib 360.

A power wire 178 may be on a portion of the third insulation layer 160, disposed in the peripheral area PA. The power wire 178 may be on the same layer as the source electrode 173 and the drain electrode 175 disposed in the display area DA. The power wire 178 may be formed of the same material in the same process as the first data conductor that includes the source electrode 173 and the drain electrode 175.

The power wire 178 may transmit a power voltage having a predetermined level, which may be applied to the light emitting diode LED, and may transmit, for example, a common voltage ELVSS.

A first organic insulation layer 181 is on the power wire 178 and the third insulation layer 160. A thickness of the first organic insulation layer 181 that overlaps the peripheral area PA and a thickness of the first organic insulation layer 181 that overlaps the display area DA may be different from each other. For example, the first organic insulation layer 181 overlapping the display area DA may have a third height h3, the first organic insulation layer 181 overlapping the peripheral area PA may have a fourth height h4, and the third height h3 may be higher than the fourth height h4. For example, the third height h3 may be about two times the fourth height h4.

The first organic insulation layer 181 having a plurality of areas, each having a different height, may be formed through a single process, and for example, may be formed by using a half-tone mask.

The first organic insulation layer 181 that overlaps the peripheral area PA may include the first valley V1 in which the first organic insulation layer 181 is removed. The first valley V1 may block a movement path through which the first organic insulation layer 181 is introduced from outside the substrate 110 to help prevent permeation of moisture into the display area DA.

The first valley V1 may have a height that is substantially the same as a thickness of the first organic insulation layer 181 disposed in the peripheral area PA. The first valley V1 may have substantially the same height as the fourth height h4.

A driving control signal line 179 and a second connection member 188 may be on the first organic insulation layer 181. The driving control signal line 179 and the second connection member 188 may be on the same layer as the first connection member 177 that is disposed in the display area DA. The driving control signal line 179 and the second connection member 188 may be formed through the same process as the first connection member 177, and may include the same material as the first connection member 177.

The second connection member 188 may be on the first organic insulation layer 181, and may be connected to the power wire 178. A part of the first organic insulation layer 181, overlapping the power wire 178, may be removed for connection between the second connection member 188 and the power wire 178.

A second organic insulation layer 182 may be on the driving control signal line 179 and the second connection member 188. In various example embodiments, a thickness of the second organic insulation layer 182 overlapping the display area DA and a thickness of the second organic insulation layer 182 overlapping the peripheral area PA may be substantially equal to each other. When the thickness of the second organic insulation layer 182 overlapping the display area DA is a first height h1 and the thickness of the second organic insulation layer 182 overlapping the peripheral area PA is a second height h2, the first height h1 and the second height h2 may be substantially equal to each other. Substantial equality not only implies complete equality but also implies that there may be a slight difference depending, for example, on process errors.

The second organic insulation layer 182 may include the second valley V2 in which the second organic insulation layer 182 is removed. The second valley V2 may block a movement path of moisture and the like introduced through the second organic insulation layer 182 from outside the substrate 110 to help prevent permeation of external moisture into the display area DA.

In various example embodiments, the first valley V1 and the second valley V2 may overlap each other. An edge of the first valley V1 and an edge of the second valley V2 may be aligned, while overlapping each other.

A third connection member 198 that is on the same layer as the pixel electrode 191 may be on the second organic insulation layer 182. The third connection member 198 may be connected to the power wire 178 through the second connection member 188, and the third connection member 198 may be connected to the common electrode 270 that overlaps the display area DA. The power wire 178 may be connected to the common electrode 270 through the third connection member 198 and the second connection member 188. When the power wire 178 transmits a common voltage ELVSS as a power voltage, the common electrode 270 may receive the common voltage ELVSS.

The third connection member 198 may be disposed in the first valley V1 and the second valley V2. The third connection member 198 may have a shape that penetrates the first organic insulation layer 181 and the second organic insulation layer 182. When the first valley V1 and the second valley V2 are filled with a material other than an organic material (like the third connection member 198), moisture or a foreign particle may be prevented from permeating into the display area DA.

At least one of dams D1 and D2 may be disposed in the peripheral area PA. The dams D1 and D2 may be on the third insulation layer 160.

The dams D1 and D2 may prevent an organic material having fluidity (like a monomer used in a process for forming the organic layer 392 of the encapsulation layer EN) from overflowing. The edge of the organic layer 392 of the encapsulation layer EN may be substantially more inside than the dams D1 and D2, and for example may be disposed inside the first dam D1. The edge of the organic layer 392 may be between the dams D1 and D2 and the display area DA.

The encapsulation layer EN extended from the display area DA may be disposed in the peripheral area PA. The first inorganic layer 391 and the second inorganic layer 393 included in the encapsulation layer EN may extend near an edge of the peripheral area PA, in which the third insulation layer 160 is disposed.

The edge of the organic layer 392 included in the encapsulation layer EN may be between the first dam D1 and the valleys V1 and V2. The organic layer 392 may be formed at a location that is close to the first dam D1, while filling the valleys V1 and V2.

The organic layer 392 may be formed using an organic material such as a monomer. The organic material may flow into the first valley V1 and the second valley V2 during a process for forming the organic layer 392. A height of the first valley V1 is determined by a thickness of the first organic insulation layer 181, and according to the example embodiment, a thickness of the first organic insulation layer 181 disposed in the peripheral area PA is thinner than a thickness of the first organic insulation layer 181 disposed in the display area DA, and accordingly the height of the first valley V1 may be lowered. Thus, the organic material provided during the process for forming the organic layer 392 may have an edge that is between the first dam D1 and the valleys V1 and V2, while sufficiently filling the first valley V1 and the second valley V2. According to the present example embodiment, the organic layer 392 and the encapsulation layer EN including the organic layer 392 may have flat top surfaces.

A plurality of touch lines TL that are connected to the touch electrode TP may be on a top surface of the encapsulation layer EN. Since the touch lines TL are formed on a significantly flat top surface, they may be stably formed.

If the height of the first valley V1 is substantially the same as the thickness of the first inorganic insulation layer 181 disposed in the display area DA, a significant amount of organic material may be required to fill the first and second valleys V1 and V2. In this case, the organic material may not be sufficient enough to flow to the periphery of the first dam D1. or may not completely fill the first valley V1 and the second valley V2. Accordingly, the top surface of the organic layer 392 may be recessed such that the organic layer 392 may not have a flat top surface. The touch lines TL connected to a touch electrode TP may be on the top surface of the organic layer 392, and it may be easy to form the touch wires TL if the top surface of the organic layer 392 is not planarized, and a short-circuit failure may occur.

Next, referring to FIG. 4, the substrate 110, the barrier layer 115, the buffer layer 120, the first insulation layer 141, the second insulation layer 142, and the third insulation layer 160, which are respectively extended from the display area DA, may be sequentially stacked in the peripheral area PA.

In the peripheral area PA, the crack dam CD may be disposed at the edge of the first insulation layer 141, the edge of the second insulation layer 142, and the edge of the third insulation layer 160. The crack dam CD may prevent spread of cracks, which may occur in an inorganic insulation layer such as the barrier layer 115, the buffer layer 120, and the like when the display panel 10 is cut corresponding to the edge of the substrate 110.

The power wire 178 may be on a portion of the third insulation layer 160, disposed in the peripheral area PA. The power wire 178 may be on the same layer as the source electrode 173 and the drain electrode 175 disposed in the display area DA. The power wire 178 may be formed of the same material in the same process as the first data conductor that includes the source electrode 173 and the drain electrode 175.

The power wire 178 may transmit a power voltage having a predetermined level, which may be applied to the light emitting diode LED, and may transmit, for example, a common voltage ELVSS.

The first organic insulation layer 181 may be on the power wire 178 and the third insulation layer 160. A thickness of the first organic insulation layer 181 disposed in the peripheral area PA may be different from a thickness of the first organic insulation layer 181 disposed in the display area DA. For example, the first organic insulation layer 181 overlapping the display area DA may have a third height h3, and the first organic insulation layer 181 overlapping the peripheral area PA may have a fourth height h4. In the present example embodiment, the third height h3 may be higher than the fourth height h4, and for example, the third height h3 may be about two times the fourth height h4.

The first organic insulation layer 181 having a plurality of areas, each having a different height, may be formed through a single process, and for example, may be formed by using a half-tone mask.

The first organic insulation layer 181 that overlaps the peripheral area PA may include the first valley V1, in which the first organic insulation layer 181 is removed.

The first valley V1 may have a height that is substantially the same as a thickness of the first organic insulation layer 181 disposed in the peripheral area PA. The first valley V1 may have substantially the same height as the fourth height h4.

The driving control signal line 179 and the second connection member 188 may be on the first organic insulation layer 181. The driving control signal line 179 and the second connection member 188 may be on the same layer as the first connection member 177 that is disposed in the display area DA. The driving control signal line 179 and the second connection member 188 may be formed through the same process as the first connection member 177, and may include the same material as the first connection member 177.

The second connection member 188 may be on the first organic insulation layer 181, and may be connected to the power wire 178. A part of the first organic insulation layer 181, overlapping the power wire 178, may be removed for connection between the second connection member 188 and the power wire 178.

The second organic insulation layer 182 may be on the driving control signal line 179 and the second connection member 188.

A thickness of the second organic insulation layer 182 overlapping the display area DA and a thickness of the second organic insulation layer 182 overlapping the peripheral area PA may be different from each other. The thickness of the second organic insulation layer 182 disposed in the peripheral area PA may be smaller than the thickness of the second organic insulation layer 182 disposed in the display area DA. The second organic insulation layer 182 overlapping the display area DA may have a first height h1, and the second organic insulation layer 182 disposed in the peripheral area PA may have a second height h2. In the present example embodiment, the first height h1 may be higher than the second height h2, and for example, the first height h1 may be about two times the second height h2.

The second organic insulation layer 182 having a plurality of areas, each having a different height, may be formed through a single process, and for example, may be formed by using a half-tone mask.

The second organic insulation layer 182 may include the second valley V2. The second valley V2 may have a height that is substantially the same as a thickness of the second organic insulation layer 182 disposed in the peripheral area PA, and for example, the second valley V2 may have the second height h2. The second valley V2 refers to an area from which the second organic insulation layer 182 is removed.

In various example embodiments, the first valley V1 and the second valley V2 may overlap each other. An edge of the first valley V1 and an edge of the second valley V2 may be aligned, while overlapping each other.

The third connection member 198 that is on the same layer as the pixel electrode 191 may be on the second organic insulation layer 182. The third connection member 198 may be formed of the same material through the same process as the pixel electrode 191.

The third connection member 198 may be connected to the power wire 178 through the second connection member 188, and the third connection member 198 may be connected to the common electrode 270 that overlaps the display area DA. The power wire 178 may be connected to the common electrode 270 through the third connection member 198 and the second connection member 188. When the power wire 178 transmits a common voltage ELVSS as a power voltage, the common electrode 270 may receive the common voltage ELVSS.

The third connection member 198 may be disposed in the first valley V1 and the second valley V2. The third connection member 198 may have a shape that penetrates the first organic insulation layer 181 and the second organic insulation layer 182. When the first valley V1 and the second valley V2 are filled with a material other than an organic material (like the third connection member 198), moisture or a foreign particle may be prevented from permeating into the display area DA.

The encapsulation layer EN may include the first inorganic layer 391, the organic layer 392, and the second inorganic layer 393. In the present example embodiment, an edge of the organic layer 392 may be between the first dam D1 and the valleys V1 and V2. The organic layer 392 may be formed at a location that is adjacent to the first dam D1, while filling the valleys V1 and V2.

The organic layer 392 may be formed using an organic material such as a monomer. The organic material may flow into the first valley V1 and the second valley V2 during a process for forming the organic layer 392. A height of the first valley V1 may be determined by the thickness of the first organic insulation layer 181, and a height of the second valley V2 may be determined by the thickness of the second organic insulation layer 182. According to the present example embodiment, the thickness of the first organic insulation layer 181 disposed in the peripheral area PA is thinner than the thickness of the first organic insulation layer 181 disposed in the display area DA, and accordingly the height of the first valley V1 may be lowered. Similarly, the thickness of the second organic insulation layer 182 disposed in the peripheral area PA is thinner than the thickness of the second organic insulation layer 182 disposed in the display area DA, and accordingly the height of the second valley V2 may be lowered. Thus, the organic material provided during the process for forming the organic layer 392 may have an edge that is between the first dam D1 and the valleys V1 and V2, while sufficiently filling the first valley V1 and the second valley V2. According to the present example embodiment, the organic layer 392 may have a flat top surface.

A plurality of touch lines TL that are connected to the touch electrode TP may be on a top surface of the encapsulation layer EN.

When the height of the first valley V1 is substantially the same as the thickness of the first inorganic insulation layer 181 and the second organic insulation layer 182 disposed in the display area DA, a significant amount of organic material may be required to fill the first and second valleys V1 and V2. In this case, the organic material may not be sufficient to flow to the periphery of the first dam D1, or may not completely fill the first valley V1 and the second valley V2. Accordingly, the top surface of the organic layer 392 may be recessed such that the organic layer 392 may not have a flat top surface. The touch lines TL connected to a touch electrode TP may be on the top surface of the organic layer 392, and it may not be easy to form the touch wires TL if the top surface of the organic layer 392 is not planarized, and a short-circuit failure may occur.

Next, referring to FIG. 5, the substrate 110, the barrier layer 115, the buffer layer 120, the first insulation layer 141, the second insulation layer 142, and the third insulation layer 160, which are respectively extended from the display area DA, may be sequentially stacked in the peripheral area PA.

In the peripheral area PA, the crack dam CD may be disposed at the edge of the first insulation layer 141, the edge of the second insulation layer 142, and the edge of the third insulation layer 160. The crack dam CD may prevent spread of cracks, which may occur in an inorganic insulation layer such as the barrier layer 115, the buffer layer 120, and the like when the display panel 10 is cut corresponding to the edge of the substrate 110. The crack dam CD may be formed of an organic material, and for example, may be formed of the same material through the same process as at least one of the first organic insulation layer 181, the second organic insulation layer 182, and the barrier rib 360.

The power wire 178 may be on a portion of the third insulation layer 160, disposed in the peripheral area PA. The power wire 178 may be on the same layer as the source electrode 173 and the drain electrode 175 disposed in the display area DA. The power wire 178 may be formed of the same material in the same process as the first data conductor that includes the source electrode 173 and the drain electrode 175.

The power wire 178 may transmit a power voltage having a predetermined level, which may be applied to the light emitting diode LED, and may transmit, for example, a common voltage ELVSS.

The first organic insulation layer 181 may be on the power wire 178 and the third insulation layer 160.

The first organic insulation layer 181 overlapping the peripheral area PA may include the first valley V1, in which the first organic insulation layer 181 is removed. The first valley V1 may block a movement of moisture introduced through the first organic insulation layer 181 to help prevent permeation of moisture into the display area DA.

The power wire 178 according to the present example embodiment may extend toward the display area DA, and for example, the power wire 178 may be partially overlapped with the first valley V1. The first valley V1 may partially expose the power wire 178.

The driving control signal line 179 and the second connection member 188 may be on the first organic insulation layer 181. The driving control signal line 179 and the second connection member 188 may be on the same layer as the first connection member 177 that is disposed in the display area DA. The driving control signal line 179 and the second connection member 188 may be formed through the same process as the first connection member 177, and may include the same material as the first connection member 177.

The second connection member 188 may be on the first organic insulation layer 181, and may be connected to the power wire 178. A part of the first organic insulation layer 181, overlapping the power wire 178, may be removed for connection between the second connection member 188 and the power wire 178. In an implementation, the second connection member 188 may be connected to the power wire 178 through the first valley V1, and this part of the first organic insulation layer 181 may not be removed in an example embodiment.

The second connection member 188 may be disposed in the first valley V1. The second connection member 188 may extend toward the display area DA, while filling the first valley V1. The second connection member 188 may be connected to the power wire 178 through the first valley V1.

The second organic insulation layer 182 may be on the driving signal control line 179 and the second connection member 188. The second organic insulation layer 182 may include the second valley V2, in which the second organic insulation layer 182 is removed.

In various example embodiments, the first valley V1 and the second valley V2 may overlap each other. The first valley V and the second valley V2 may be aligned at their edges, while overlapping each other.

The third connection member 198 that is on the same layer as the pixel electrode 191 may be on the second organic insulation layer 182. The third connection member 198 may be formed of the same material through the same process as the pixel electrode 191.

The third connection member 198 may be connected to the power wire 178 through the second connection member 188, and the third connection member 198 may be connected to the common electrode 270 that overlaps the display area DA. The power wire 178 may be connected to the common electrode 270 through the third connection member 198 and the second connection member 188. When the power wire 178 transmits a common voltage ELVSS as a power voltage, the common electrode 270 may receive the common voltage ELVSS.

The third connection member 198 may be disposed in the first valley V1 and the second valley V2. The third connection member 198 may have a shape that penetrates the first organic insulation layer 181 and the second organic insulation layer 182. The third connection member 198 may contact the second connection member 188 in the first valley V1 and the second valley V2. The third connection member 198 is connected to the second connection member 188 through the second valley V2, and the second connection member 188 is connected to the power wire 178 through the first valley V1 and thus may transmit a common voltage.

The first valley V1 and the second valley V2 may be mostly filled with a material other than an organic material like the second connection member 188 and the third connection member 198. Thus, moisture or a foreign particle may be prevented from permeating into the display area DA by the first and second valleys V1 and V2.

At least one of dams D1 and D2 may be disposed in the peripheral area PA. The dams D1 and D2 may prevent an organic material having fluidity (like a monomer used in a process for forming the organic layer 392 of the encapsulation layer EN) from overflowing. Thus, the edge of the organic layer 392 of the encapsulation layer EN may be substantially more inside than the dams D1 and D2, and for example may be disposed inside the first dam D1.

The edge of the organic layer 392 may be between the dams D1 and D2 and the display area DA. The edge of the organic layer 392 may be between the first dam D1 and the valleys V1 and V2. The organic layer 392 may extend to a location adjacent to the first dam D1, while filling the valleys V1 and V2.

The organic layer 392 may be formed using an organic material such as a monomer. The organic material may flow into the first valley V1 and the second valley V2 during a process for forming the organic layer 392. In the present example embodiment, the first valley V1 is in a state of being filled by the second connection member 188, and the second valley V2 is in a state of being filled by the third connection member 198. Thus, the organic material provided during the process for forming the organic layer 392 may have an edge that is between the first dam DI and the valleys V1 and V2, while sufficiently filling the first valley V1 and the second valley V2 even with a small amount. The organic layer 392 formed on such a structure may have a planarized top surface.

A plurality of touch lines TL that are connected to the touch electrode TP may be on a top surface of the encapsulation layer EN.

Figure 6:
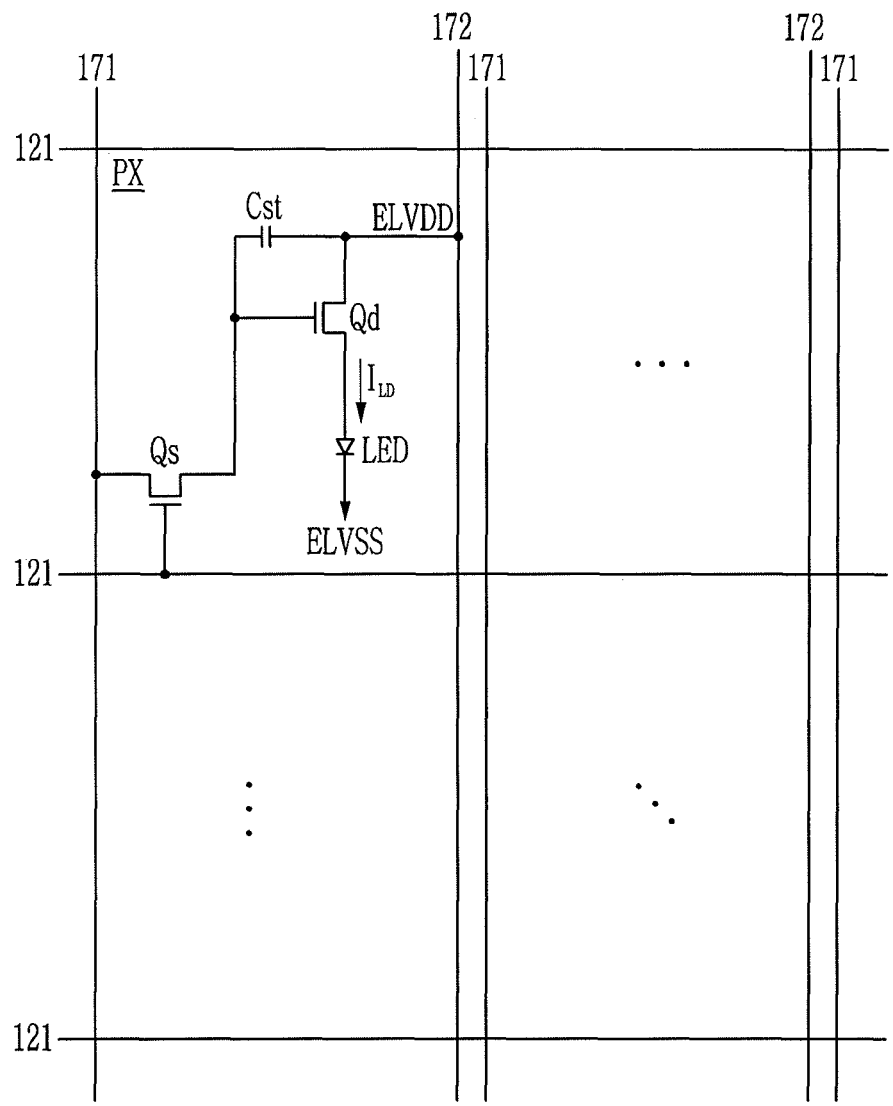
FIG. 6 illustrates an equivalent circuit diagram of a pixel of a display device according to an example embodiment.
Figure 7:
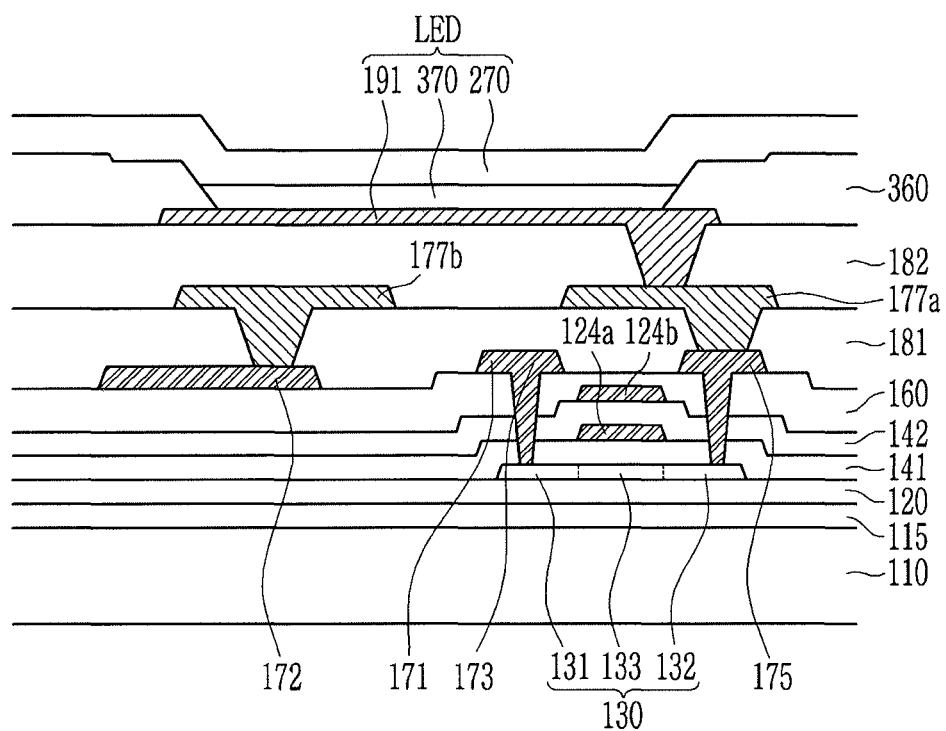
FIG. 7 illustrates a schematic cross-sectional view of the pixel of the display device according to an example embodiment.

Hereinafter, a display area of a display device according to the present example embodiment will be described with reference to FIG. 6 and FIG. 7. FIG. 6 is a circuit diagram of one pixel of a display device according to the present example embodiment, and FIG. 7 is a schematic cross-sectional view of the pixel of the display device according to the example embodiment.

First, referring to FIG. 6, the pixel PX may be an area partitioned by a plurality of signal lines 121, 171, and 172. The pixel PX may be a minimum unit for displaying an image. The display device displays an image by using a plurality of pixels.

The signal lines may include a plurality of gate lines 121 transmitting a gate signal (or a scan signal), a plurality of data lines 171 transmitting a data signal, and a plurality of driving voltage lines 172 transmitting a driving voltage ELVDD. In the present example embodiment, the data line 171 and the driving voltage line 172 are included in a data conductor, and the gate line 121 will be called a gate conductor.

The gate lines 121 may extend substantially in a row direction and generally in parallel to each other, and vertical direction portions of the data lines 171 and the driving voltage lines 172 may extend substantially in a column direction and generally in parallel to each other.

Each pixel PX may include a switching thin film transistor Qs, a driving thin film transistor Qd, a storage capacitor Cst, and a light emitting diode LED. Each pixel PX may further include a transistor and a capacitor for compensation of a current supplied to the light emitting diode LED.

In the present example embodiment, the switching thin film transistor Qs transmits a data signal applied to the data line 171 to the driving thin film transistor Qd in response to a scan signal applied to the gate line 121. The driving thin film transistor Qd flows an output current $I_{LD}$ of which magnitude varies depending on a voltage applied between a control terminal and an output terminal. The capacitor Cst charges a data signal applied to the control terminal of the driving thin film transistor Qd, and maintains the charging of the data signal even after the switching thin film transistor Qs is turned off.

In the present example embodiment, the light emitting diode LED includes an anode connected to the output terminal of the driving thin film transistor Qd and a cathode connected to a common voltage ELVSS. The light emitting diode LED displays an image by changing intensity according to the output current $I_{LD}$ of the driving thin film transistor Qd.

Next, referring to FIG. 7, an interlayered structure of an area where the storage capacitor, the driving thin film transistor, and the like are disposed will be described. A repeated description of similar features provided with reference to FIG. 2 may be omitted in the following description.

The barrier layer 115 may be on the substrate 110 to help prevent permeation of externally introduced moisture or a foreign particle. The buffer layer 120 may be on the barrier layer 115. The buffer layer 120 may block an impurity, which may spread to the semiconductor layer 130 from the substrate 110 during a process for forming the semiconductor layer 130, and may reduce a stress applied to the substrate 110. Each of the barrier layer 115 and the buffer layer 120 may include an inorganic insulation material such as a silicon oxide, a silicon nitride, and the like.

The semiconductor layer 130 may be on the buffer layer 120. The semiconductor layer 130 may include the channel region 133 that overlaps a gate electrode 124a, the source region 131, and the drain region 132. In the present example embodiment, the source region 131 and the drain region 132 are respectively disposed at opposite sides of the channel region 133 and are doped with an impurity. The semiconductor layer 130 may include a polysilicon, an amorphous silicon, or an oxide semiconductor.

The first insulation layer 141 that includes an inorganic insulation material such as a silicon oxide, a silicon nitride, and the like, or an organic insulation material, may be on the semiconductor layer 130. The first insulation layer 141 may also be referred to as a first gate insulation layer.

A first gate conductor that includes a scan line and the gate electrode 124a of the transistor may be on the first insulation layer 141.

The second insulation layer 142 may be on the first insulation layer 141 and the first gate conductor. The second insulation layer 142 may include an inorganic insulation material such as a silicon oxide, a silicon nitride, and the like, or an organic insulation material. The second insulation layer 142 may also be referred to as a second gate insulation layer.

A second gate conductor such as a storage line that includes a storage electrode 124b may be on the second insulation layer 142. The gate electrode 124a and the storage electrode 124b may form the storage capacitor described with reference to FIG. 6.

The third insulation layer 160 may be on the second gate conductor. The third insulation layer 160 may include an inorganic insulation material such as a silicon oxide, a silicon nitride, and the like, or an organic insulation material.

A first data conductor that includes a data line, the first driving voltage line 172, and the source electrode 173 and the drain electrode 175 of a transistor may be on the third insulation layer 160.

Each of the source electrode 173 and the drain electrode 175 may be connected to the source region 131 and the drain region 132 of the semiconductor layer 130 through contact holes formed in the insulation layer 160, the second insulation layer 142, and the first insulation layer 141, respectively.

In the present example embodiment, the gate electrode 124a, the source electrode 173, and the drain electrode 175 form a transistor, together with the semiconductor layer 130. In the transistor shown in the drawing, the gate electrode 124a is disposed above the semiconductor layer 130, but a structure of the transistor may be variously modified.

The first organic insulation layer 181 may be on the third insulation layer 160 and the first data conductor. The first organic insulation layer 181 may include an organic insulation material, and for example, may include may include a polyimide, an acryl-based polymer, a siloxane-based polymer, and the like.

A second data conductor that includes the first connection member 177 and the second driving voltage line 177b may be on the first organic insulation layer 181.

The first connection member 177 may connected the drain electrode 175 and the pixel electrode 191. The second driving voltage line 177b may be connected to the first driving voltage line 172 and may transmit a driving voltage. The second driving voltage line 177b may reduce resistance by being connected to the first driving voltage line 172, and may provide a high-luminance and high-frequency display panel.

In the present example embodiment, the second organic insulation layer 182 is on the second data conductor and the first organic insulation layer 181. The second organic insulation layer 182 may include an organic insulating material, and may include, for example, a polyimide, an acryl-based polymer, and the like.

The pixel electrode 191 of the light emitting diode LED may be on the second organic insulation layer 182. The pixel electrode 191 may be connected to the first connection member 177 through a contact hole formed in the second organic insulation layer 182, and may be connected to the drain electrode 175 through the first connection member 177.

The barrier rib 360 having an opening that overlaps the pixel electrode 191 may be on the second organic insulation layer 182. An opening of the barrier rib 360 may define each pixel area. The barrier rib 360 may be referred to as a pixel defining layer. The barrier rib 360 may include an organic insulating material or an inorganic insulating material.

In the present example embodiment, the emission layer 370 is on the pixel electrode 191 that overlaps the opening of the barrier rib 360, and a common electrode 270 is on the emission layer 370.

In the present example embodiment, the pixel electrode 191, the emission layer 370, and the common electrode 270 of each pixel form a light emitting diode LED such as an organic light emitting diode. The display device may have a structure of any one of a front display type, a rear display type, and a one panel dual display type, depending upon the light-emitting direction of the light emitting diode LED.

Above the common electrode, as previously described with reference to FIG. 2, an encapsulation layer and a touch electrode may be sequentially disposed.

By way of summation and review, instead of sealing light emitting elements by using an encapsulation substrate, an encapsulation layer may be formed on the light emitting elements, which may reduce the weight of the display panel, and reduce the possibility of damage to the display panel.

Most of the display panel may be a display area that emits an image, but a specific area of the display panel, for example, an edge area of the display panel, may be a peripheral area where a driving circuit, a signal line, and the like are disposed.

Embodiments may provide a display panel in which an organic layer of an encapsulation layer disposed in a peripheral area may have a flat top surface. Accordingly, touch lines formed on the encapsulation layer may be stably formed. Thus, a display device with improved reliability may be provided. Embodiments may provide a display device in which a top surface of an encapsulation layer disposed in a peripheral area, for example, an organic layer included in the encapsulation layer, may be made to be flat, which may help enable formation of touch lines on the encapsulation layer.

DESCRIPTION OF SYMBOLS

DA: display area
PA: peripheral area
110: substrate
191: pixel electrode
270: common electrode Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a substrate that includes a display area and a peripheral area;
   a transistor in the display area;
   a pixel electrode connected to the transistor;
   a common electrode that overlaps the pixel electrode; and
   an organic insulation layer that is between the common electrode and the substrate, and overlaps at least a part of the peripheral area, wherein:
   a thickness of a portion of the organic insulation layer overlapping the display area, and a thickness of a portion of the organic insulation layer overlapping the peripheral area, are different from each other, and
   the organic insulation layer includes a valley that penetrates the organic insulation layer, while overlapping the peripheral area.

2. The display device as claimed in claim 1, wherein the organic insulation layer overlapping the display area has a first height, the organic insulation layer overlapping the peripheral area has a second height, and the first height is higher than the second height.

3. The display device as claimed in claim 2, wherein the first height is about two times the second height.

4. The display device as claimed in claim 1, wherein the display device further comprises an encapsulation layer that is on the common electrode and overlaps the display area and the peripheral area, and
   the encapsulation layer includes:
   a first inorganic layer and a second inorganic layer and
   an organic layer between the first inorganic layer and the second inorganic layer.

5. The display device as claimed in claim 4, wherein touch lines are on the encapsulation layer that overlaps the peripheral area, and
   a touch electrode is on the encapsulation layer that overlaps the display area.

6. The display device as claimed in claim 5, wherein one side of the encapsulation layer on which the touch lines are disposed, and one side of the encapsulation layer on which the touch electrode is disposed, have a step difference.

7. The display device as claimed in claim 4, wherein the organic layer is disposed in the valley.

8. The display device as claimed in claim 4, further comprising a dam disposed in the peripheral area,
   wherein a distance from the dam to an edge of the display area is greater than a distance from an edge of the organic layer to the edge of the display area.

9. The display device as claimed in claim 1, wherein the transistor further includes:
   a semiconductor layer on the substrate;
   a gate electrode overlapping the semiconductor layer; and
   a source electrode and a drain electrode that are connected to the semiconductor layer,
   wherein the display device further comprises a first connection member that is on the drain electrode and connecting the pixel electrode and the drain electrode.

10. The display device as claimed in claim 9, wherein the organic insulation layer includes:
    a first organic insulation layer that is between the source electrode and the first connection member and between the drain electrode and the first connection member; and
    a second organic insulation layer that is between the first connection member and the pixel electrode.

11. The display device as claimed in claim 10, wherein one area overlapping the display area and another area overlapping the peripheral area of at least one of the first organic insulation layer and the second organic insulation layer have a thickness difference.

* * * * *